(12) United States Patent
Lerner

(10) Patent No.: US 8,307,822 B2
(45) Date of Patent: Nov. 13, 2012

(54) HIGH EFFICIENCY SOLAR ENERGY DEVICES AND METHODS

(75) Inventor: Scott Lerner, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 768 days.

(21) Appl. No.: 12/246,096

(22) Filed: Oct. 6, 2008

(65) Prior Publication Data

US 2010/0083953 A1 Apr. 8, 2010

(51) Int. Cl.
*F24J 2/10* (2006.01)

(52) U.S. Cl. ........ 126/683; 126/684; 126/685; 126/686; 136/256; 136/257; 359/639; 359/640

(58) Field of Classification Search .......... 126/684–686, 126/683; 359/490, 634, 639, 640
See application file for complete search history.

(56) References Cited

U.S. PATENT DOCUMENTS

| | | | | |
|---|---|---|---|---|
| 3,478,219 A * | 11/1969 | Nutz | ........................... | 250/208.2 |
| 4,021,267 A * | 5/1977 | Dettling | ........................... | 136/246 |
| 4,092,531 A * | 5/1978 | Moss | ........................... | 250/216 |
| 4,204,881 A * | 5/1980 | McGrew | ........................... | 136/246 |
| 4,350,837 A * | 9/1982 | Clark | ........................... | 136/246 |
| 4,367,366 A * | 1/1983 | Bloss et al. | ........................... | 136/246 |
| 4,433,199 A * | 2/1984 | Middy | ........................... | 136/246 |
| 5,172,186 A * | 12/1992 | Hosoe | ........................... | 356/493 |
| 5,517,480 A * | 5/1996 | Matsuoka et al. | ........ | 369/110.04 |
| 7,098,395 B2 * | 8/2006 | Hiraishi et al. | ........................... | 136/251 |
| 7,158,306 B1 | 1/2007 | Cobb | | |
| 7,529,029 B2 * | 5/2009 | Duncan et al. | ........................... | 359/637 |
| 7,741,557 B2 * | 6/2010 | Cobb et al. | ........................... | 136/246 |
| 2007/0107769 A1 | 5/2007 | Cobb et al. | | |
| 2007/0289622 A1 * | 12/2007 | Hecht | ........................... | 136/246 |
| 2008/0048102 A1 | 2/2008 | Kurtz et al. | | |
| 2009/0314332 A1 * | 12/2009 | Barnett et al. | ........................... | 136/246 |
| 2010/0032005 A1 * | 2/2010 | Ford et al. | ........................... | 136/246 |

OTHER PUBLICATIONS

"Optical Instrumentation Division", https://www.osa.org/membership/techgroups/designandinstrumentation/ODIPresentation9-07.pdf.

* cited by examiner

*Primary Examiner* — Kenneth Rinehart
*Assistant Examiner* — Jorge Pereiro

(57) ABSTRACT

A solar energy device includes a first prism with a dichroic surface and a reflective surface opposite the dichroic surface. A first solar cell is positioned to receive light rays passing through the dichroic surface. A second solar cell positioned to receive light rays from the reflective surface.

17 Claims, 3 Drawing Sheets

HIGH EFFICIENCY SOLAR ENERGY DEVICES AND METHODS

GOVERNMENTAL RIGHTS IN THE INVENTION

The invention that is the subject of this patent application was made under Government support under Subcontract No. CW135971, under Prime Contract No. HR0011-07-9-0005, through the Defense Advanced Research Projects Agency (DARPA). The government has certain rights in this invention.

BACKGROUND

Today, most electronic equipment requires access to a source of power such as electrical wall outlets or batteries that can weigh as much or more than the equipment itself. The equipment may be used where electrical outlets are unavailable. In some instances, battery packs may be recharged but again this requires an electrical wall outlet or other power source. Further, battery packs may typically only be used for a very limited time before they need to be recharged again.

As the need for alternative energy sources increases, increasingly efficient solar power systems are being developed. Known solar cell systems typically concentrate the sun's rays and often require sophisticated tracking optics to consistently capture the most intense sunlight. Solar systems capable of providing enough power to operate many devices are often bulky and heavy and thus are not practical for use in portable devices.

SUMMARY

In some embodiments, a solar energy device includes a first prism with a dichroic surface and a reflective surface opposite the dichroic surface. A first solar cell is positioned to receive light rays passing through the dichroic surface. A second solar cell positioned to receive light rays from the reflective surface.

BRIEF DESCRIPTION OF THE DRAWINGS

Embodiments of the invention relating to both structure and method of operation may best be understood by referring to the following description and accompanying drawings.

DETAILED DESCRIPTION

A very high efficiency solar cell (VHESC) system is disclosed that uses a prism that splits solar light into different energy bins and directs them onto solar cells of various light sensitive materials to cover the solar spectrum. A solar energy device is described that includes a lens with a convex surface. Incoming light rays impinge the convex curved surface and emerge from the other side of the lens at an angle such that the rays converge toward a prism some distance from the lens. The components of the solar energy device are stationary. The lens is configured with a wide acceptance angle that captures large amounts of light and eliminates the need for complicated tracking devices to maximize efficiency.

Figure 1A:
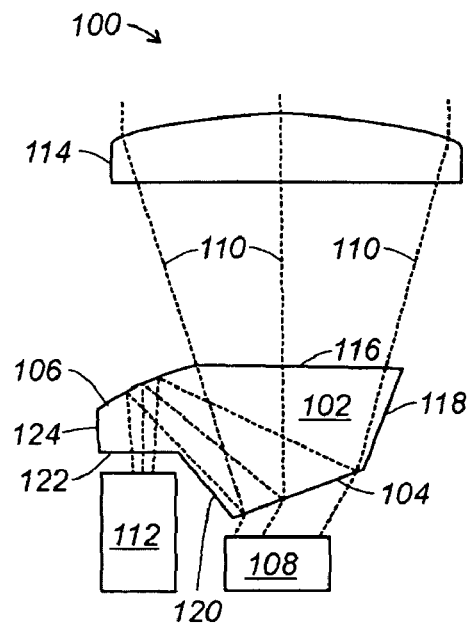
FIG. 1A is a schematic diagram of a side view of an embodiment of a solar energy device.

FIG. 1A is a schematic diagram of a side view of an embodiment of solar energy device 100 with prism 102 that includes dichroic surface 104 and reflective surface 106 opposite dichroic surface 104. A first solar cell 108 is positioned to receive light rays 110 passing through prism 102 and dichroic surface 104. A second solar cell 112 is positioned to receive light rays from the reflective surface 106. A lens 114 can be included that is configured to direct the light rays toward the first prism. The lens 114 can have positive optical power, which refers to the optics of the lens 114 causing the light rays to converge at some distance from the lens 114. If a collimated beam of light passing through a lens is diverged (spread), the lens is referred to as a negative or diverging lens.

Lens 114 can be optically shaped with a wide acceptance angle to capture large amounts of light and eliminate the need for complicated tracking devices. Solar energy device 100 can alternatively be configured with tracking devices in other embodiments.

Dichroic surface 104 is configured to selectively pass incoming light of a selected color or range of colors while reflecting other colors. Prism 102 is configured so that at least some of the light reflected from dichroic surface 104 is directed to reflective surface 106 interior to prism 102. Solar cells 108, 112 can be designed for optimum performance at different selected wavelengths. Accordingly, dichroic surface 104 can be configured to pass light at the optimum wavelengths for solar cell 108. Similarly, reflective surface 106 can be configured to pass light at the optimum wavelengths for solar cell 112. In some embodiments, solar cell 108 is configured for optimum performance using light that is in the longer wavelength regions, i.e. near, mid and far infrared. These wavelengths of light have low energy per photon (a photon is the minimum energy level of the electric field associated with the wave) while solar cell 112 is configured for optimum performance using light rays that are in the medium-high energy wavelength region. Although FIG. 1A shows two solar cells 108, 112 for purposes of explanation, other suitable numbers and combinations of solar cells 108, 112 and light energy can be utilized.

Prism 102 can be embodied in various shapes. In the cross-sectional view of the embodiment shown, prism 102 has a perimeter with seven (7) sides that are dimensioned and oriented to maximize exposure of solar cells 108, 112 to incoming and reflected light rays 110. The first side is a relatively flat surface 116 receiving converged light rays 110 from lens 114. Moving clockwise around prism 102, a side surface 118 separates dichroic surface 104 from flat surface 116 so that dichroic surface 104 is positioned opposite flat surface 116. Dichroic surface 104 is typically oriented at an angle relative to flat surface 116 to allow at least some of the light rays 110 to be reflected to reflective surface 106.

Side surface 120 is oriented at an angle between dichroic surface 102 and another flat surface 122. Light rays 110 reflected from reflective surface 106 pass through flat surface 122 in prism 102 to solar cell 112. Note that orienting side surface 120 at an angle increases efficiency by reducing the distance the light rays 110 travel through prism 102, however, side surface 120 can be omitted so that flat surface 122 is adjacent to dichroic surface 104.

Another side surface couples flat surface 122 to reflective surface 106. Reflective surface 106 is shown with a convex curve to concentrate and reflect the light rays 110 reflected from dichroic surface 104 to solar cell 112. Reflective surface 106 is coupled to flat surface 116 to complete the perimeter of prism 102.

Figure 1B:
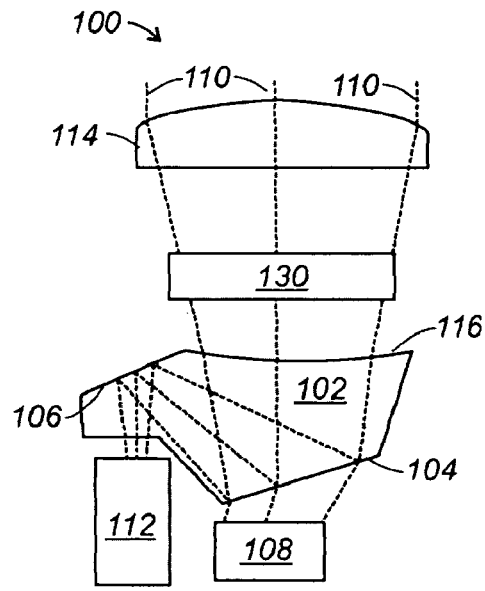
FIG. 1B is a diagram of another embodiment of a solar energy device.

Referring to FIG. 1B, a schematic diagram of a side view of another embodiment of a solar energy device 100 is shown including an additional solar cell 130 positioned between lens 114 and prism 102. In some embodiments, solar cell 130 is configured to absorb high-energy light rays 110 from lens 114 while passing mid-energy and low energy light rays 110 to prism 102. Prism 102 is configured to conduct light rays 110 to respective mid-energy solar cell 112 and low energy solar cell 108 via dichroic surface 104 and a reflective surface 106 opposite the dichroic surface 104.

Solar cell 130 can be optically configured so that the angle of light rays 110 is unchanged as light rays 110 pass through solar cell 130. Depending on the size of solar cell 130, prism 102 can include a concave surface 116 receiving light rays 110 from solar cell 130. Concave surface 116 causes light rays 110 to diverge through prism 102 to reduce angles on the dichroic coating 104 thus maximizing efficiency of the coating to allow maximum light exposure of solar cell 108 to light rays 110. Depending on the range of coverage and angle of reflection of light rays 110 from dichroic surface 104, reflective surface 106 can be straight, convex (negative optical energy), or concave (positive optical energy) to maximize exposure of solar cell 112 to light rays 110.

Solar cells 108, 112, 130 are photovoltaic (PV) cells made of semiconductor material such as silicon. A portion of light rays 110 striking the cells 108, 112, 130 is absorbed within the semiconductor material, transferring the energy of the absorbed light to the semiconductor allowing an electron-hole pair to be created. Solar cells 108, 112, 130 can also have one or more electric fields that act to force electron-hole pairs freed by light absorption to flow in a certain direction to provide electric current. Metal contacts (not shown) can be placed on the top and bottom of the solar cells 108, 112, 130 to draw electrical current for external use.

Note that other suitable numbers and configurations of solar cells and dichroic/reflective surfaces can be utilized in solar energy devices 100.

Figure 2:
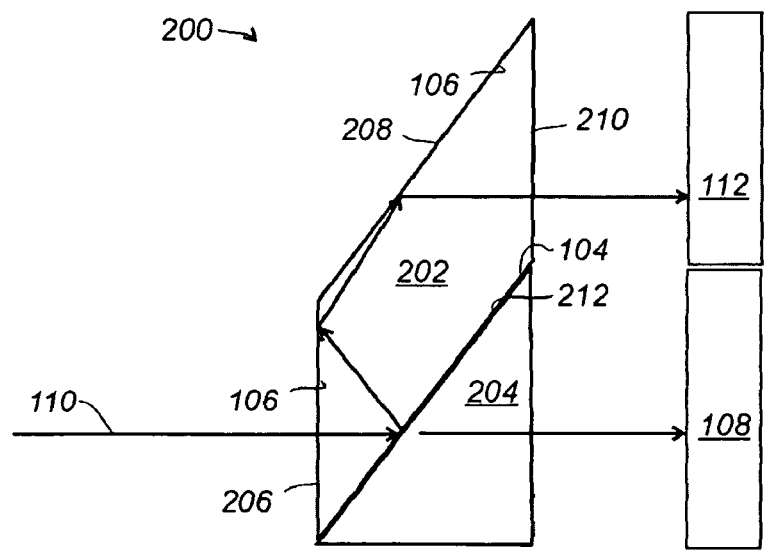
FIG. 2 is a diagram of an embodiment of a spectral splitting device for a solar energy device.

FIG. 2 shows a schematic diagram of a side view of and embodiment of a spectral splitting device 200 that can be used in a solar energy device including prism 202 configured to filter incoming broadband light rays 110 of a selected energy level and supply the filtered light rays 110 to corresponding solar cell 108. A second prism 204 is positioned adjacent prism 202.

In the embodiment shown, prism 202 has a parallelogram cross-section and dichroic surface 104 on the inner portion of side 212 is oriented at an angle relative to the incoming light rays 110. Light rays 110 enter prism 202 through side 206. Prism 202 has four sides 206, 208, 210, 212. Side 206 is parallel to side 210 and side 208 is parallel to side 212. Sides 208, 212 can be longer than sides 206, 210. The angles between sides 206/212 and 208/210 are smaller than the angles between sides 206/208 and 210/212. Prism 204 can have a right triangular cross section with a hypotenuse that is adjacent to side 212 with dichroic surface 104 of the first prism 202 so that the light rays 110 pass through the second prism 204 to solar cell 108.

Prism 202 can be further configured with reflective surfaces 106 on sides 206, 208. Light rays 110 are reflected from dichroic surface 104 to side 206, then to side 208, and then through prism 202 to solar cell 112. Solar energy device 200 allows the collecting surfaces of solar cell 108, 112 to be positioned in the same plane, which can be easier to manufacture than devices with components in multiple planes. Additionally, the sides/surfaces of prisms 202, 204 are typically straight and easier to manufacture than prisms with curved surfaces, and/or more irregular shapes, such as prism 102 (FIGS. 1A, 1B).

Figure 3:
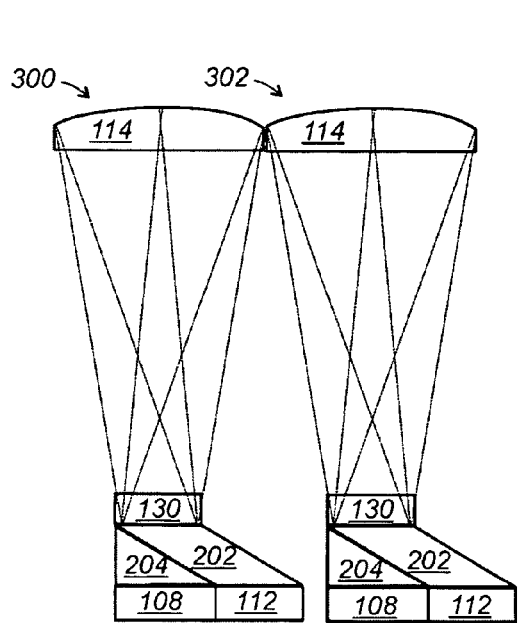
FIG. 3 is a diagram of another embodiment of a solar energy device.

FIG. 3 shows a diagram of compact, highly efficient embodiment of solar energy devices 300, 302 including lenses 114, high energy solar cells 130, parallelogram prisms 202 adjacent triangular prisms 204, low energy solar cells 108, and mid-energy solar cells 112. High energy solar cells 130 extend across one side of parallelogram prisms 202 and can be optically configured so that the angle of light rays 110 is unchanged as light rays 110 pass through solar cell 130. Low and mid-energy solar cells 108 that collect wavelengths of light in the low energy regions of the spectrum and the mid energy regions 112 are positioned to receive corresponding light rays from adjacent prisms 202, 204. Lenses 114 focus incoming broadband light toward high energy solar cells 130. In some embodiments, solar cell 130 is configured to absorb high-energy light rays 110 from lens 114 while passing mid-energy and low energy light rays 110 to prism 202. Note that other suitable numbers and configurations of solar cells and dichroic/reflective surfaces can be utilized in solar energy devices 300, 302.

Figure 4:
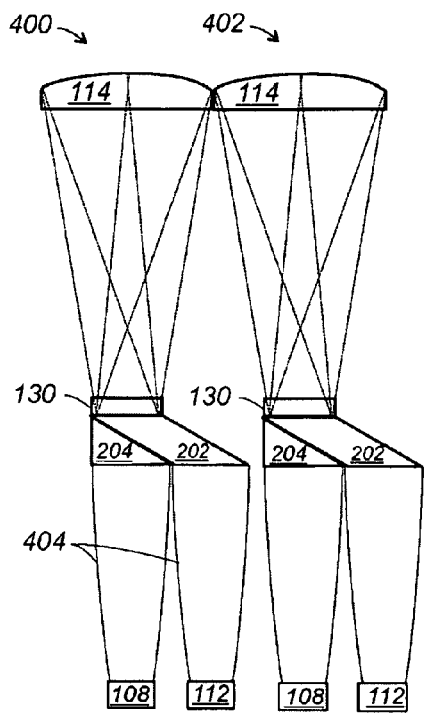
FIG. 4 is a diagram of another embodiment of a solar energy device.

FIG. 4 shows a diagram of an embodiment of solar energy devices 400, 402 including lenses 114, high energy solar cells 130, parallelogram prisms 202 adjacent triangular prisms 204, low energy solar cells 108, and mid-energy solar cells 112. High energy solar cells 130 extend across one side of parallelogram prisms 202 and can be optically configured so that the angle of light rays 110 is unchanged as light rays 110 pass through solar cell 130. Low and mid-energy solar cells 108, 112 are positioned at some distance from prisms 202, 204 to receive corresponding light rays from prisms 202, 204 via concentrators 404. Lenses 114 focus incoming broadband light toward high energy solar cells 130. In some embodiments, solar cell 130 is configured to absorb high-energy light rays 110 from lens 114 while passing mid-energy and low energy light rays 110 to prism 202. Concentrators 404 concentrate or converge the light emerging from prisms 204, 202 toward solar cells 108, 112, thus saving cost by allowing solar cells 108, 112 to be smaller in size than they would be if positioned closer to prisms 202, 204. Note that other suitable numbers and configurations of solar cells, concentrators, and dichroic/reflective surfaces can be utilized in solar energy devices 400, 402.

Figure 5A:
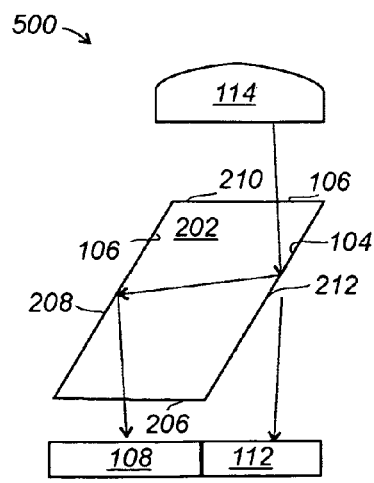
FIGS. 5A-5C show diagrams of an embodiment of a solar energy device using a prism to supply light rays arriving at different angles to solar cells.
Figure 5B:
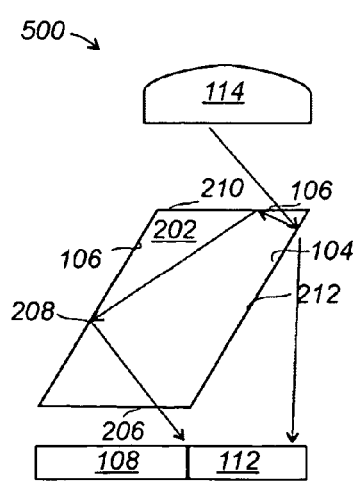
Figure 5C:
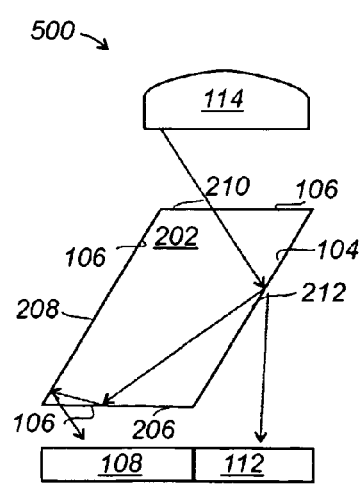

FIGS. 5A-5C show diagrams of an embodiment of solar energy device 500 using a parallelogram prism 202 to supply light rays arriving at different angles to solar cells 108, 112. Solar energy device 500 includes a lens 114, solar cells 130, parallelogram prisms 202, low energy solar cell 108, and mid-energy solar cell 112. Low and mid-energy solar cells 108, 112 are positioned to receive corresponding light rays from prism 202. Prism 202 can include dichroic surface on side 212, and reflective surfaces 106 on sides 206, 208, 210. Light passes through lens 114 to dichroic surface 104, which allows light at a selected energy level to pass through prism 202 to solar cell 112. Depending on the angle of the incoming light, the remaining portion of the light can be reflected to one or more sides 206, 208, 210 of prism 202 enroute to the other solar cell 108.

For example, in FIG. 5A, a portion of the incoming light passes through dichroic surface 104 to solar cell 112. The remaining portion of the light is reflected to side 208 and exits prism 202 through side 206 enroute to solar cell 108. In FIG. 5B, a portion of the incoming light passes through dichroic surface 104 to solar cell 112. The remaining portion of the light is reflected to sides 210, then to side 208, and exits prism 202 through side 206 enroute to solar cell 108. In FIG. 5C, a portion of the incoming light again passes through dichroic surface 104 to solar cell 112. The remaining portion of the light is reflected to sides 206, then to side 208, and exits prism 202 through side 206 enroute to solar cell 108. Accordingly, the reflective surfaces 106 can be configured to reflect light at certain angles to enable the light that would other miss solar cell 108 to be redirected through prism 202 and emerge from prism 202 within the dimensions of solar cell 108. Note that other suitable numbers and configurations of solar cells, concentrators, and dichroic/reflective surfaces can be utilized in solar energy device 500.

Figure 6:
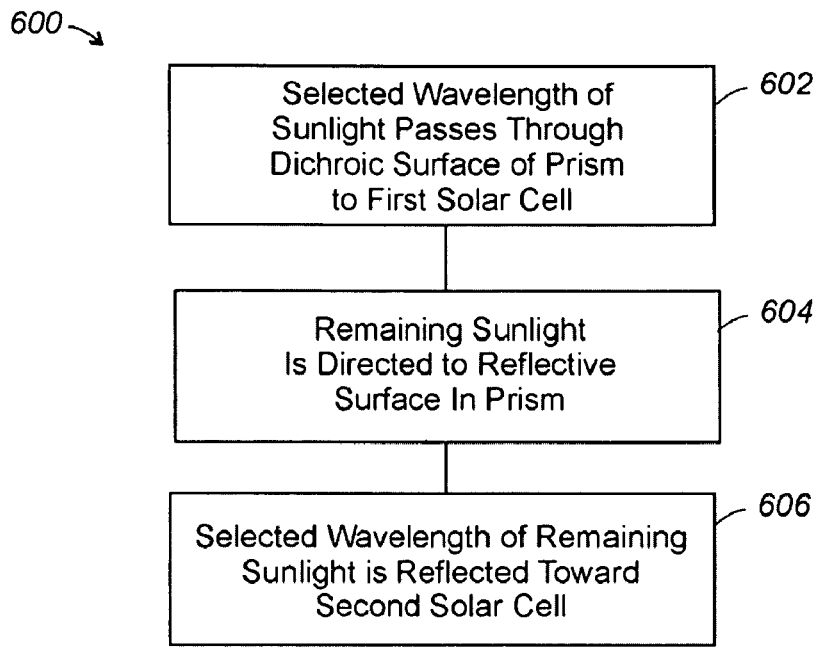
FIG. 6 is a flow diagram of an embodiment of a method for providing solar energy.
Figure 7:
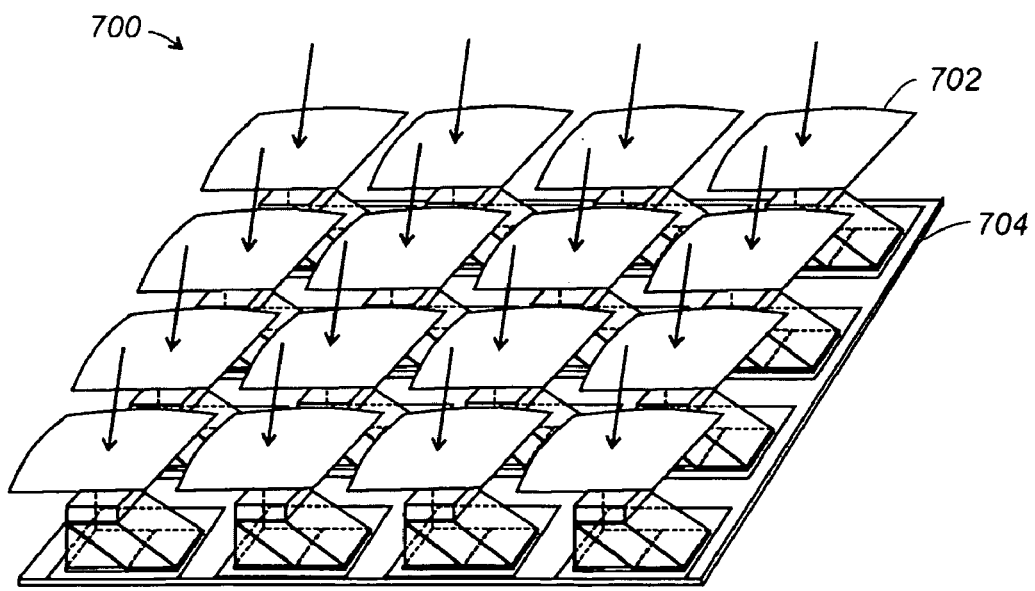
FIG. 7 is a diagram of an embodiment of a solar energy system.

Referring to FIG. 6, a flow diagram of an embodiment of a method 600 for providing light to solar cells is shown. Process 602 can include allowing a portion of sunlight at a selected wavelength to pass to a first solar cell through a dichroic surface in a prism. Process 604 can include directing a remaining portion of the sunlight toward a reflective surface in the prism. Process 606 can include directing a selected wavelength or range of wavelengths of the remaining portion of the sunlight toward a second solar cell. In some embodiments, collecting surfaces of the first solar cell and the second solar cell are positioned in the same plane. As further discussed herein in connection with solar devices 100, 200, 300, 400, and 500, the prism can be positioned to receive the sunlight after it passes through a third solar cell. The first solar cell can receive sunlight having different energy than the sunlight received by the second solar cell. The prism can include a front surface with negative optical power, and a reflective surface with positive optical power. Additionally, a lens can be used to direct the sunlight toward the prism. The prism can be a parallelogram and the dichroic surface can be oriented at an angle relative to the sunlight. A second prism shaped as a right triangle with a hypotenuse that is adjacent to the dichroic surface of the prism can be included so that the sunlight passes through the second prism to the first solar cell.

Referring to FIGS. 1-5 and 7, FIG. 7 shows an embodiment of a solar energy system 700 that includes plurality of solar energy devices 702 coupled to a substrate 704. Solar energy devices 702 can be implemented using solar energy devices 100 (FIGS. 1A, 1B), 200 FIG. 2), 300 (FIG. 3), 400 (FIG. 4), and/or 500 (FIG. 5). A first group of solar cells 108 receive light rays from a dichroic surface 104 in the optical prisms, such as prism 102 or 202. A second group of solar cells receive light rays from a reflective surface 106 in the optical prisms. The collecting surfaces of the first and second group of solar cells can be positioned in the same plane. Stationary optical lenses 114 can be configured to direct the light rays to the optical prisms.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. In the claims, unless otherwise indicated the article "a" is to refer to "one or more than one".

What is claimed is:

1. A solar energy device comprising:
a first prism including a dichroic surface and a reflective surface opposite the dichroic surface;
a first solar cell positioned to receive light rays passing through the dichroic surface; and
a second solar cell positioned to receive light rays from the reflective surface,
wherein the first prism includes a front surface with negative optical power, and the reflective surface has positive optical power.

2. The solar energy device of claim 1 further comprising:
a third solar cell; and
the first prism is positioned to receive light rays that pass through the third solar cell.

3. The solar energy device of claim 2 further comprising:
the first solar cell receives low energy light rays;
the second solar cell receives medium energy light rays; and
the third solar cell received medium energy light rays.

4. The solar energy device of claim 1 further comprising:
a lens with positive optical power configured to direct the light rays toward the first prism.

5. The solar energy device of claim 1 further comprising:
a stationary lens configured to direct the light rays toward the first prism.

6. The solar energy device of claim 1 further comprising:
a second reflective surface adjacent the dichroic surface.

7. The solar energy device of claim 1 further comprising:
the first prism is a parallelogram and the dichroic surface is oriented at an angle relative to the light rays.

8. The solar energy device of claim 1 further comprising:
a second prism adjacent to the first prism, the second prism is a right triangle with a hypotenuse that is adjacent to the dichroic surface of the first prism so that the light rays pass through the second prism to the first solar cell.

9. The solar energy device of claim 8 further comprising:
a first concentrator and a second concentrator;
the solar cells are positioned at a distance from the first and second prisms and receive corresponding light rays from the first and second prisms via the first and second concentrators.

10. The solar energy device of claim 1 further comprising:
collecting surfaces of the first solar cell and the second solar cell are positioned in the same plane.

11. A method comprising:
allowing a portion of sunlight at a selected wavelength to pass to a first solar cell through a dichroic surface in a prism including a front surface with negative optical power; and
directing a remaining portion of the sunlight toward a second solar cell via a reflecting surface in the prism, the reflecting surface having positive optical power.

12. The method of claim 11 further comprising:
directing a remaining portion of the sunlight in a selected direction via a plurality of the reflecting surfaces in the prism.

13. The method of claim 11 further comprising:
collecting surfaces of the first solar cell and the second solar cell are positioned in the same plane.

14. The method of claim 11 further comprising:
the prism is positioned to receive the sunlight after it passes through a third solar cell.

15. A solar energy system comprising:
a plurality of optical prisms, including a front;
a first plurality of solar cells configured to receive light rays from a dichroic surface in the optical prisms,
a second plurality of solar cells configured to receive light rays from a plurality of reflective surfaces in the optical prisms, collecting surfaces of the first and second plurality of solar cells are positioned in the same plane; and
a plurality of stationary optical lenses configured to direct the light rays to the optical prisms,
wherein each optical prism has at least two of the reflective surfaces, such that the light rays are reflected at least twice by the at least two of the reflective surfaces within each optical prism before reaching the second plurality of solar cells,
and wherein the reflective surfaces have positive optical power.

16. The solar energy system of claim 15 further comprising:
the optical prisms include a second reflective surface adjacent the dichroic surface; and
the optical prisms have a parallelogram shape and the dichroic surface is oriented at an angle relative to the light rays.

17. The solar energy system of claim 15 further comprising:
a second plurality of prisms adjacent to the first prisms, the second prisms are shaped as a right triangle with a hypotenuse adjacent to the dichroic surface of the first prisms so that the light rays pass through the second prisms to the first solar cells.

* * * * *

UNITED STATES PATENT AND TRADEMARK OFFICE
CERTIFICATE OF CORRECTION

PATENT NO. : 8,307,822 B2  
APPLICATION NO. : 12/246096  
DATED : November 13, 2012  
INVENTOR(S) : Scott Lerner Page 1 of 1

It is certified that error appears in the above-identified patent and that said Letters Patent is hereby corrected as shown below:

In column 6, line 24, in Claim 3, delete "received" and insert -- receives --, therefor.

In column 6, line 32, in Claim 6, before "the dichroic" insert -- to --.

In column 7, line 2, in Claim 15, delete "front;" and
insert -- front surface with negative optical power; --, therefor.

In column 8, line 4, in Claim 16, before "the dichroic" insert -- to --.

Signed and Sealed this
Fifth Day of March, 2013

Teresa Stanek Rea
*Acting Director of the United States Patent and Trademark Office*